US007833859B2

(12) United States Patent
Lee

(10) Patent No.: US 7,833,859 B2
(45) Date of Patent: Nov. 16, 2010

(54) METHOD FOR SIMULTANEOUSLY MANUFACTURING SEMICONDUCTOR DEVICES

(75) Inventor: Hee Bae Lee, Bucheon Si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 138 days.

(21) Appl. No.: 12/337,866

(22) Filed: Dec. 18, 2008

(65) Prior Publication Data
US 2009/0170266 A1 Jul. 2, 2009

(30) Foreign Application Priority Data
Dec. 27, 2007 (KR) .................... 10-2007-0138461

(51) Int. Cl.
*H01L 21/8247* (2006.01)
(52) U.S. Cl. .............................. 438/258; 257/E21.179
(58) Field of Classification Search ......... 438/239–266; 257/E21.179
See application file for complete search history.

(56) References Cited

U.S. PATENT DOCUMENTS 5,225,700 A * 7/1993 Smayling .................... 257/321
6,815,794 B2 * 11/2004 Shin et al. ................... 257/500

* cited by examiner

*Primary Examiner*—Richard A. Booth

(57) ABSTRACT

Methods for manufacturing semiconductor devices simultaneously to implement low-voltage and high-voltage devices in a single chip. In one example embodiment, a method includes various acts. An isolation layer is formed on a wafer. A gate oxide layer and a lower gate poly are sequentially formed on a first low-voltage transistor region. A first poly oxide layer is formed. A nitride layer is formed on the first poly oxide layer. The nitride layer and the first poly oxide layer are etched. A field oxide layer is formed by selectively oxidizing portions exposed by the etching. A second poly oxide layer is formed. Gate patterns of each transistor region are completed by vapor-depositing an upper gate poly on a high-voltage transistor region, the first low-voltage transistor region and a second low-voltage transistor region. A source and drain region are formed.

7 Claims, 3 Drawing Sheets

METHOD FOR SIMULTANEOUSLY MANUFACTURING SEMICONDUCTOR DEVICES

CROSS-REFERENCE TO A RELATED APPLICATION

This application claims the benefit of Korean Patent Application No. 10-2007-0138461, filed on Dec. 27, 2007 which is hereby incorporated by reference as if fully set forth herein.

BACKGROUND

1. Field of the Invention

Example embodiments of the present invention relate to manufacturing semiconductor devices, and more particularly, to methods for manufacturing semiconductor devices simultaneously to include low-voltage and high-voltage devices in a single chip.

2. Description of the Related Art

With improvements in integration of semiconductor devices and developments in semiconductor manufacturing technology, attempts have been made to manufacture systems with one-chip semiconductors. Such one-chip semiconductors integrate multiple circuits in a single chip. For example, the circuits that operate a controller and a memory of a system can be integrated in a single chip in order to increase stability in a low-voltage environment.

In order to achieve lightness and integration of a system, a circuit unit which controls a power supply of the system, an input terminal, and an output terminal of the circuit unit can be integrated in a single chip. Since the input terminal and the output terminal are high voltage terminals, it is impossible to structure a general low-voltage transistor circuit including an input terminal and an output terminal. Therefore, currently input and output terminals are structured in high-voltage power transistors. Further, a low-voltage device and a high-voltage device must be separately manufactured when structuring the low-voltage device and the high-voltage device in a single chip. The separate manufacture of low-voltage and high-voltage devices increases the complexity and manufacturing time of the manufacturing process.

SUMMARY OF EXAMPLE EMBODIMENTS

In general, example embodiments of the present invention relate to methods for simultaneously manufacturing semiconductor devices. Some example embodiments enable both low-voltage and high-voltage devices to be simultaneously manufactured in a single chip.

In one example embodiment, a method for simultaneously manufacturing semiconductor devices includes various acts. First, an isolation layer is formed on a wafer to separate a low-voltage device region and a high-voltage device region from each other. Next, a gate oxide layer and a lower gate poly are sequentially formed on a first low-voltage transistor region of the low-voltage device region. Then, a first poly oxide layer is formed on a whole surface of the wafer. Next, a nitride layer is formed on the first poly oxide layer. Then, the nitride layer and the first poly oxide layer are etched to partially remove the nitride layer and the first poly oxide layer from the high-voltage device region. Next, a field oxide layer is formed by selectively oxidizing portions of the high-voltage device region exposed by the etching. Then, a second poly oxide layer is formed on the whole surface of the wafer. Next, gate patterns of each transistor region are completed by vapor-depositing an upper gate poly on a high-voltage transistor region of the high-voltage device region, the first low-voltage transistor region, and a second low-voltage transistor region of the low-voltage device region. Finally, a source and drain region are formed on the wafers of the high-voltage transistor region and the first and the second low-voltage transistor regions.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description of the present invention are exemplary and explanatory and are intended to provide further explanation of the invention as claimed.

BRIEF DESCRIPTION OF THE DRAWINGS

Aspects of example embodiments of the present invention will become apparent from the following detailed description of example embodiments given in conjunction with the accompanying drawings, in which.

DETAILED DESCRIPTION OF EXAMPLE EMBODIMENTS

In general, example embodiments of the present invention relate to methods for simultaneously manufacturing semiconductor devices. In the following detailed description of the embodiments, reference will now be made in detail to specific embodiments of the present invention, examples of which are illustrated in the accompanying drawings. Wherever possible, the same reference numbers will be used throughout the drawings to refer to the same or like parts. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

FIGS. 1-5 are sectional views illustrating an example method for simultaneously manufacturing semiconductor devices. As disclosed in FIG. 5, a high-voltage transistor 60, such as a power gate device, is formed on a high-voltage device region. Simultaneously, low-voltage transistors 70 and 80, such as a floating gate device and a standard gate, are formed on a low-voltage device region.

Figure 1:
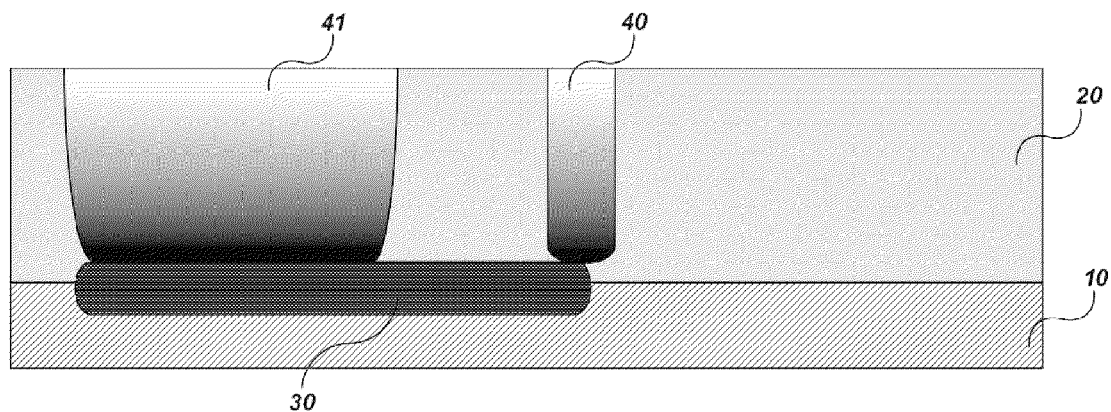
FIGS. 1-5 are sectional views illustrating an example process for simultaneously manufacturing semiconductor devices.

As disclosed in FIG. 1, an N-type buried layer 30 is formed in a wafer 10, and an epitaxial layer 20 is grown over the N-type buried layer 30 and the wafer 10. Dopant ions are implanted in the epitaxial layer 20, thereby forming a first deep well 40 and a second deep well 41.

Figure 2:
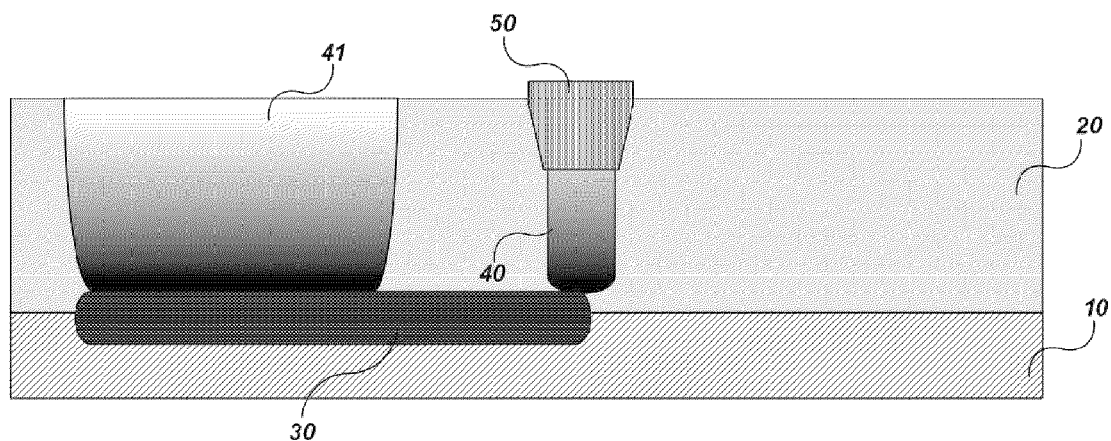

As disclosed in FIG. 2, an isolation layer 50 is next formed on the first deep well 40 to separate a low-voltage device region and a high-voltage device region from each other. The isolation layer 50 may be formed, for example, by etching a trench in the first deep well 40 to a depth that is less than the depth of the first deep well 40, vapor-depositing a filler in the trench, and then performing planarization. The filler may be vapor-deposited by an atmospheric pressure chemical vapor deposition (AP-CVD) method. The planarization may be performed by a chemical mechanical planarization (CMP) method. It is understood, however, that other methods of vapor deposition and/or planarization may alternatively be employed.

Alternatively, a pad dielectric layer comprising an oxide layer and a nitride layer may be sequentially vapor-deposited on the whole surface of the wafer 10 exposed before the isolation layer 50 is formed. After formation of the isolation layer 50, the pad dielectric layer is removed from the wafer 10.

Figure 3:
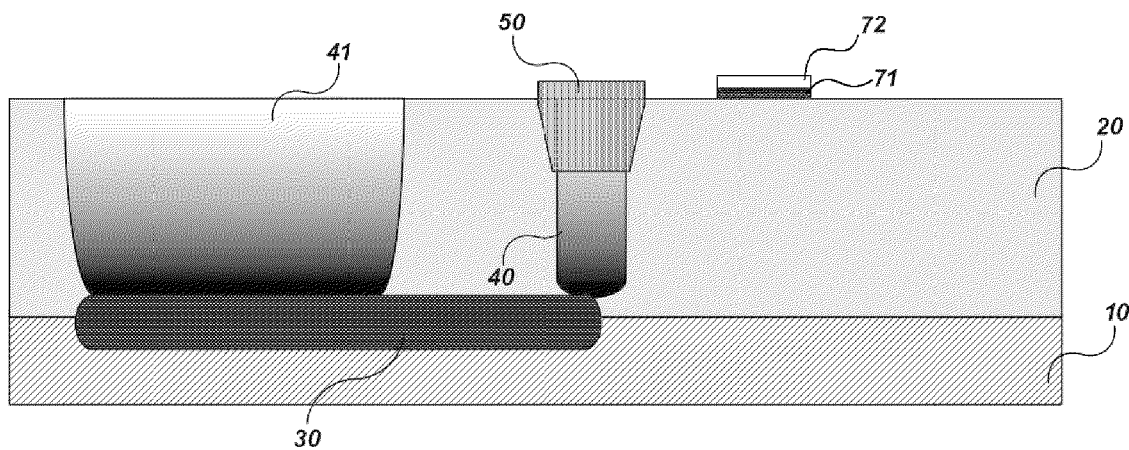

Next, as disclosed in FIG. 3, a photoresist is patterned in the low-voltage device region, and etching is performed using the photoresist pattern, thereby sequentially forming a gate oxide layer 71 and a lower gate poly 72 in a first low-voltage transistor region. As mentioned previously, a first low-voltage transistor having a floating gate is formed in the first low-voltage transistor region. Accordingly, the lower gate poly 72 operates as a floating gate.

Figure 4:
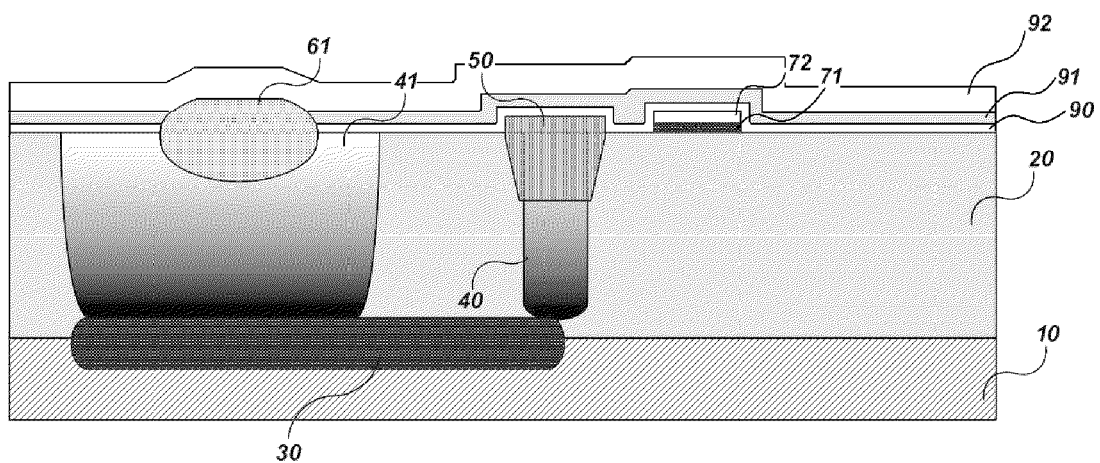

As disclosed in FIG. 4, a first poly oxide layer 90 is next vapor-deposited on the exposed surfaces of the semiconductor device including the isolation layer 50, the gate oxide layer 71, and the lower gate poly 72. A nitride layer 91 is then vapor-deposited on the first poly oxide layer 90. Next, etching is performed using a photoresist pattern to partially expose the second deep well 41 formed in the high-voltage device region. The nitride layer 91 and the first poly oxide layer 90 are next partially removed, thereby partially exposing an upper part of the second deep well 41 of the high-voltage device region. In addition, the second deep well 41 exposed by the etching is selectively oxidized so that a field oxide layer 61 is formed. Next, a second poly oxide layer 92 is vapor-deposited on the whole surface of the semiconductor device. Accordingly, an oxide-nitride-oxide (ONO) layer is formed in the first low-voltage transistor region of the low-voltage device region. The ONO layer includes the first poly oxide layer 90, the nitride layer 91, and the second poly oxide layer 92.

Figure 5:
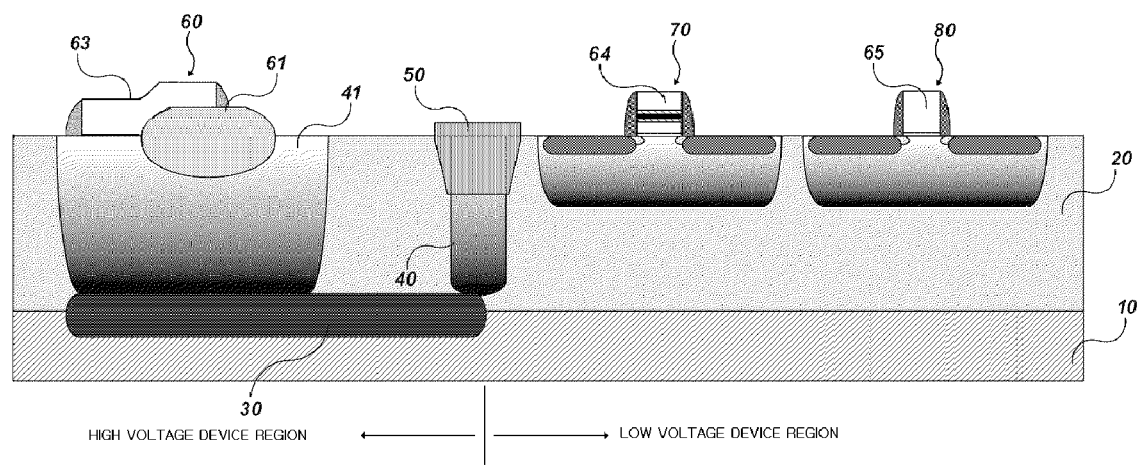

As disclosed in FIG. 5, upper gate polys 63, 64, and 65 are next vapor-deposited simultaneously on the high-voltage transistor region 60 of the high-voltage device region, the first low-voltage transistor region 70, and the second low-voltage transistor region 80 of the low-voltage device region, respectively. The vapor-deposition of upper gate polys 63, 64, and 65 completes the formation of the gate patterns of the respective transistor regions.

In some example embodiments, the first gate poly 63 is vapor-deposited on an upper part of the field oxide layer 61 in the high-voltage transistor region 60 of the high-voltage device region. In the example embodiment disclosed in FIG. 4, only part of the first gate poly 63 overlaps the field oxide layer 61.

In some example embodiments, the second gate poly 64 is vapor-deposited on the second poly oxide layer 92 (see FIG. 4) in the first low-voltage transistor region 70 of the low-voltage device region. In some example embodiments, the second gate poly 64 may be a control gate.

In some example embodiments, the third gate poly 65 is vapor-deposited on a part of the nitride layer 91 (see FIG. 4) in the second low-voltage transistor region 80 of the low-voltage device region.

In some alternative embodiments, spacers (not shown) are formed at the gate patterns of each transistor, and source and drain regions for the respective gate patterns are formed on the wafer 10. Accordingly, the high-voltage device and the low-voltage device are simultaneously manufactured. Specifically, spacers are formed on both sides of the gate poly 63 of the high-voltage transistor region. Also, spacers are formed on both sides of the gate structures 71, 72, 90-92, and 64 of the first low-voltage transistor region 70 (see FIG. 4). In addition, spacers are formed on both sides of the gate structures 90-92 and 65 of the second low-voltage transistor region (see FIG. 4).

In the example methods for simultaneously manufacturing semiconductor devices disclosed herein, a high-voltage device such as a power gate device and a low-voltage device such as a floating gate device or a standard gate device can be simultaneously formed on a single chip, rather than having to be formed separately. Therefore, the manufacturing process can be simplified and manufacturing time can be decreased. The example methods disclosed herein can further improve efficiency of device manufacturing processes when applied to fusion chips which include multiple devices.

Although example embodiments of the present invention have been shown and described, various modifications and variations might be made to these example embodiments. The scope of the invention is therefore defined in the following claims and their equivalents.

What is claimed is:

1. A method for simultaneously manufacturing semiconductor devices, comprising:
   forming an isolation layer on a wafer to separate a low-voltage device region and a high-voltage device region from each other;
   sequentially forming a gate oxide layer and a lower gate poly on a first low-voltage transistor region of the low-voltage device region;
   forming a first poly oxide layer on a surface of the wafer;
   forming a nitride layer on the first poly oxide layer;
   etching the nitride layer and the first poly oxide layer to partially remove the nitride layer and the first poly oxide layer from the high-voltage device region;
   forming a field oxide layer by selectively oxidizing portions of the high-voltage device region exposed by the etching;
   forming a second poly oxide layer on a whole surface of the wafer;
   completing gate patterns of each transistor region by vapor-depositing an upper gate poly on a high-voltage transistor region of the high-voltage device region, the first low-voltage transistor region, and a second low-voltage transistor region of the low-voltage device region; and
   forming a source and drain region on the wafers of the high-voltage transistor region and the first and the second low-voltage transistor regions.

2. The method according to claim 1, wherein the high-voltage transistor comprises a power gate device, the first low-voltage transistor comprises a floating gate device, and the second low-voltage transistor comprises a standard gate device.

3. The method according to claim 1, further comprising:
   forming spacers on both sidewalls of each gate pattern of the respective transistor regions.

4. The method according to claim 1, wherein completing gate patterns of each transistor region comprises:
   vapor-depositing a first gate poly on the field oxide layer of the high-voltage transistor region;

vapor-depositing a second gate poly on the second poly oxide layer of the first low-voltage transistor region; and vapor-depositing a third gate poly on the nitride layer disposed on the second poly oxide.

5. The method according to claim 1, wherein the isolation layer is formed by forming a trench on the wafer, vapor-depositing a filler in the trench, and then planarizing the filler.

6. The method according to claim 5, wherein the filler is vapor-deposited by atmospheric pressure chemical vapor deposition (AP-CVD).

7. The method according to claim 5, wherein the filler is planarized by chemical mechanical planarization (CMP).

* * * * *